United States Patent [19]

McCarthy

[11] Patent Number: 5,030,793
[45] Date of Patent: Jul. 9, 1991

[54] INTEGRATED EMI FILTER AND THERMAL HEAT SINK

[75] Inventor: Michael P. D. McCarthy, Palatine, Ill.

[73] Assignee: Motorola Inc., Schaumburg, Ill.

[21] Appl. No.: 520,302

[22] Filed: May 7, 1990

[51] Int. Cl.$^5$ .......................... H05K 9/00; H01P 1/22
[52] U.S. Cl. ................................ 174/35 R; 333/81 B; 361/424
[58] Field of Search .................. 333/81 R, 81 B, 208, 333/209, 210, 211, 248, 252; 219/10.55 D, 10.55 R; 361/424; 174/35 R, 35 GC, 16.1, 16.3

[56] References Cited

U.S. PATENT DOCUMENTS 3,767,884 10/1973 Osepchuk et al. ............... 219/10.55
4,053,731 10/1977 Foerstner ..................... 219/10.55 D

FOREIGN PATENT DOCUMENTS 158409 8/1954 Australia ........................... 333/81 B

OTHER PUBLICATIONS

Electromagnetic Shielding by Donald R. White and M. Mordiguion, vol. 3, Chapter 7, Section 7.2.5, Intererference Control Technologies, Inc., Gainsville, Va. 1988.

*Primary Examiner*—Leo P. Picard
*Assistant Examiner*—Bot L. Ledynh
*Attorney, Agent, or Firm*—Val Jean F. Hillman

[57] ABSTRACT

The present invention discloses an apparatus that shields electronic equipment from electromagnetic interference. The apparatus is a partially enclosed box having a substantially enclosed cavity. Disposed within the cavity is electronic equipment that is either sensitive to or responsible for generating unwanted EMI radiation. Within each apparatus are cooling air openings. Within each opening is a heat sink device, dimensioned to provide a level of EMI filtering. The heat sink device has a dual function. First, as an EMI filter, it attenuates EMI radiation in the range of frequencies generated by or disruptive to the electronic equipment. Secondly, as a heat sink device, it transfers heat away from the apparatus. In this way, the apparatus of the present invention successfully provides an EMI filter that doubles as a heat sink.

8 Claims, 1 Drawing Sheet

INTEGRATED EMI FILTER AND THERMAL HEAT SINK

TECHNICAL FIELD

This invention relates generally to Electromagnetic Interference (EMI) shielding techniques. More specifically, however, this invention relates to an EMI filter that doubles as a heat sink.

BACKGROUND OF THE INVENTION

EMI is the unintentional radiation from electronic equipment which can interfere with external equipment such as radio, television, or computer units. Additionally, EMI radiation is capable of interfering with internal circuitry within the unit generating the EMI. In recent years, EMI has taken on greater importance because of the substantial use and increased density of electronic components which either generate or are susceptible to the effects of EMI. In computers and related fields which employ digital technologies, EMI is an extremely sensitive issue because of the increased speed of operation of digital circuits Modern digital circuits are capable of generating and processing signals with rise times as short as two nanoseconds. Unfortunately, these signals, while they represent a substantial increase in the speed of operation, are natural source of wide spectrum interference. One of the most troubling EMI problems therefore, is how to prevent these extremely fast digital circuits from interfering with the operation of other digital circuits positioned nearby.

Prior art techniques for containing EMI have been confined essentially to placing shielding screens in enclosures that surround the interference producing equipment. An alternative approach has been simply to place the interference producing equipment into a screened room. The type of screening generally employed is shown in FIG. 1 This type shielding is typically made of a conducting materials such as aluminum, and operates on the basic principal that the EMI will not pass through the apertures in the screen. For an in depth discussion on this phenomenon, refer to White, Donald R. J., Mardiguian, M. "Electromagnetic Shielding," Vol.3, Chapter 7, Interference Control Technologies Inc., Gainsville, Va., 1988.

Despite the plausibility of shielding screens, their use nonetheless suffers from various shortcomings. For example, installation is a labor intensive effort, which represents a substantial cost in the development of a shielded enclosure. While an improperly fitted screen will render an enclosure susceptible to intolerable levels of EMI leakage, more problematic are the effects of screen seal degradation under normal use and wear. Over time, the screen seals which fix the shielding screens within an enclosure degrade. Eventually, EMI leakage will necessitate refitting the entire enclosure. Because of the cost associated with each of these steps, there is a desire to avoid the use of shielding screens in the next generation shielded enclosure.

SUMMARY OF THE INVENTION

Accordingly, a general object of the present invention is to provide an apparatus capable of housing electronic equipment that either generates or is susceptible to EMI radiation.

Another object of the present invention is to provide an apparatus capable of filtering EMI radiation.

Yet another object of the present invention is to provide an apparatus that filters the unwanted EMI without the use of shielding screens.

A further object of the present invention is to provide an economic means of transfering heat away from the apparatus of the present invention.

These and other objects are achieved by the present invention which, briefly described, is an apparatus that shields electronic equipment from electromagnetic radiation. The apparatus has a substantially enclosed cavity. Disposed within the cavity is the electronic equipment that is either sensitive to or responsible for generating unwanted EMI. Within each apparatus is a cooling air opening. Within the opening is an EMI filter. This filter has a dual function. First, it is dimensioned to filter and attenuate EMI radiations in the range of frequencies disruptive to electronic equipment operation. Secondly, the EMI shield is also a heat sink, designed to transfer heat away from the apparatus. In this way, the apparatus of the present invention successfully provides an EMI filter that doubles as a heat sink.

DETAILED DESCRIPTION OF THE PREFERRED EMBODIMENT

Figure 1:
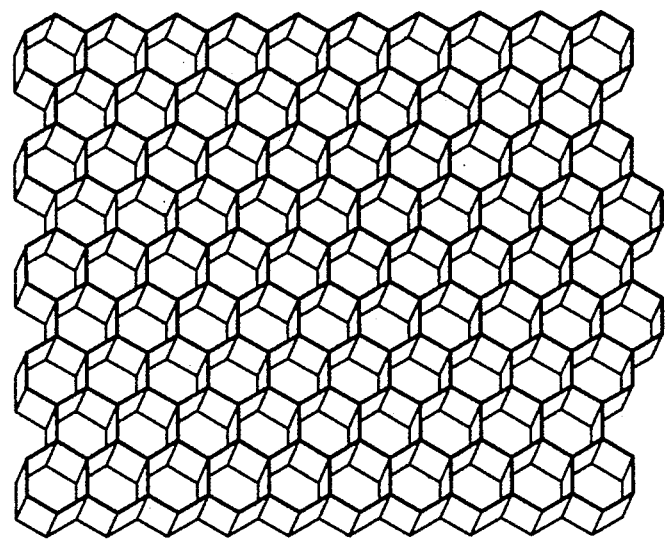
FIG. 1 is an example of the type shielding screen typically employed by the prior art.
Figure 2:
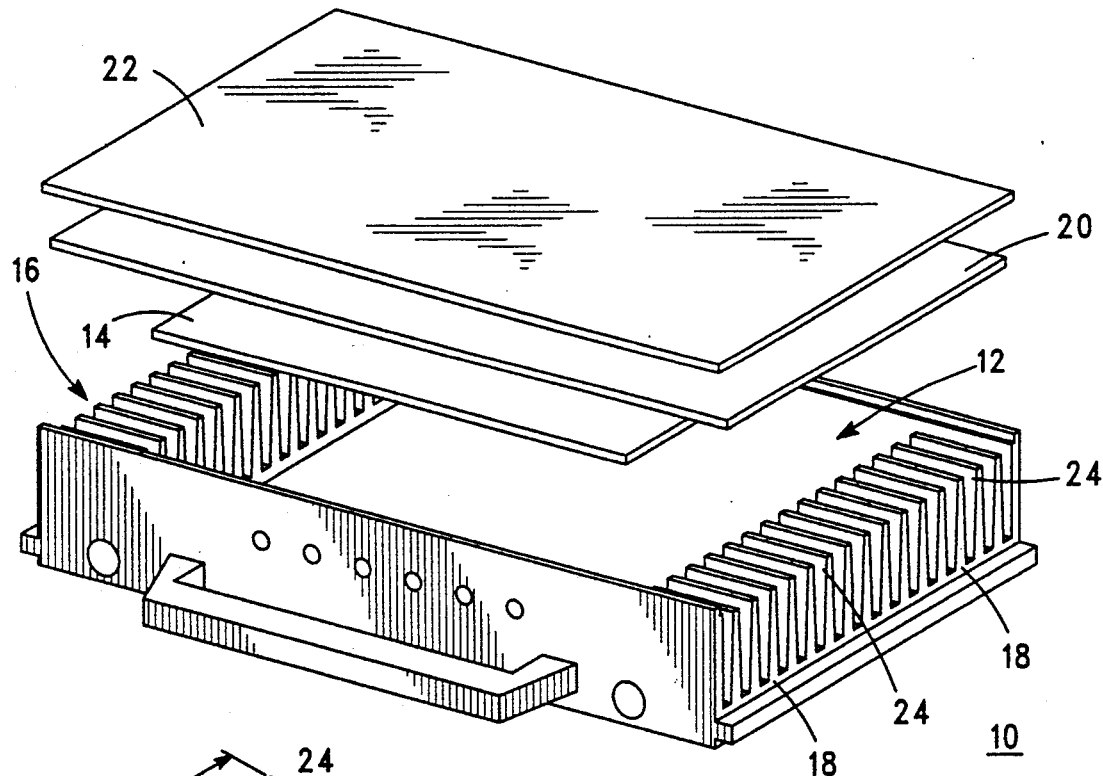
FIG. 2 is an exploded view of the apparatus according to the invention.

A principal application of the present invention is the shielding of electronic equipment (e.g. printed circuit boards), especially those that utilize digital circuit technology. FIG. 2 is a exploded view of the apparatus according to the present invention. The apparatus is shown generally as 10 in FIG. 2. The apparatus has a centrally located cavity 12, which houses the electronic equipment 14 that is sensitive to or responsible for generating unwanted EMI radiation. According to FIG. 2, at opposing ends of the apparatus are openings 16. Disposed within the openings are heat sink fins 18. When conductive gasket 20 is lowered into place such that it rests across the top surface of the heat sink fins 18, the gasket and heat sink fins form a waveguide array. The cover 22 is then lowered into place and secured to the apparatus.

The previously described gasket/heat sink combination also defines air passages 24 between the heat sink fins 18 that permit the flow of forced cooled air to pass between the heat sink fins and into the apparatus cavity 12. In this way, the cooling air removes the heat absorbed by the heat sink fins, as well as removing heat from electronic equipment 14 disposed within the cavity 12.

Figure 3:
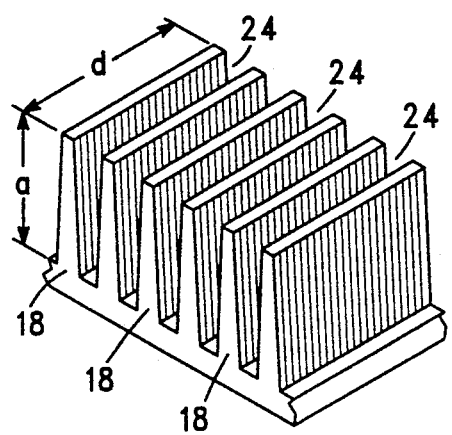
FIG. 3 is a perspective view of the dimensioned heat sink fins according to the invention.

FIG. 3 is a perspective view of the dimensioned heat sink fins according to the present invention. Due to heat sink fin dimensioning, the air passages 24 act like an electromagnetic waveguide array that filters and attenuates a predetermined range of EMI radiation. The theoretical principals controlling the present invention are best expressed by equations (1) through (10) which describe a method of calculating waveguide dimensions whereby an EMI cutoff frequency and an EMI attenuation/absorption loss level can be established.

Assuming a known EMI radiation range of frequencies, and a desired EMI cut-off frequency, appropriate heat sink fin dimensions can be calculated per the following discussion.

First, determine the EMI wavelength for the maximum anticipated EMI frequency.

EMI wavelength;

$$\lambda_a = \frac{c}{f} \tag{1}$$

where c is approximately the speed of light and f is the maximum anticipated EMI frequency.

Recognizing that the EMI cut-off frequency for a particular waveguide is determined by the waveguide's longest cross-section, determine that cross-sectional dimension.

Cut-off frequency;

$$f_c = \frac{1}{2a\sqrt{\mu_o \epsilon_o}} \tag{2}$$

where
$\mu_o$ = permeability of free space = $4\pi \times 10^{-7}$ H/M,
$\epsilon_o$ = permitivity of free space = $8.85 \times 10^{-12}$ F/M, and
a = the longest dimension measured in meters.

Equation (2) reduces to:

$$f_c = \frac{5.9 \times 10^9}{a(\text{inches})} \tag{3}$$

$$a(\text{inches}) = \frac{5.9 \times 10^9}{f_c} \tag{4}$$

where $f_c$ is the desired EMI cut-off frequency, and a is the longest cross-sectional dimension of the heat sink fin measured in inches.

Next, determine the cut-off frequency wavelength for the desired EMI cut-off frequency.

Cut-off frequency wavelength;

$$\lambda_c = \frac{c}{f_c} \tag{5}$$

where c is again the speed of light and fc is the desired EMI cut-off frequency.

Finally, recognizing that the EMI attenuation for a particular waveguide is a function of the waveguide's depth, calculate the appropriate depth dimension. The attenuation of a deep hole is given by:

Attenuation / Absorption Loss in dB;

$$AdB = 0.0046 \, df \sqrt{\left(\frac{f_c}{f^2}\right) - 1} \tag{6}$$

where AdB is the attenuation loss measured in decibels, d is the hole depth in centimeters, f is the EMI frequency measured in megahertz, and $f_c$ is the cut-off frequency measured in megahertz. Equation (6) may also be expressed as:

$$AdB = 54.5 \left(\frac{d}{\lambda_c}\right) \times \sqrt{1 - \left(\frac{\lambda_c}{\lambda_a}\right)^2} \tag{7}$$

$$d = \frac{AdB(\lambda_c)}{54.5 \times \sqrt{1 - \left(\frac{\lambda_c}{\lambda_a}\right)^2}} \tag{8}$$

where AdB is the attenuation loss measured in decibels, $\lambda_c$ is the cut-off frequency wavelength, $\lambda_a$ is the EMI wavelength, and d is the waveguide depth measured in inches. In theory, equations (6) reduce to:

$$AdB = 27.3 \frac{d}{g} \text{ for square or rectangular holes} \tag{9}$$

$$AdB = 32 \frac{d}{g} \text{ for round holes} \tag{10}$$

where d = hole depth in centimeters, and g = largest transverse dimension of the hole in centimeters, and $f_c/f > 3$ (corresponding to a 5 percent error).

Assuming a maximum EMI frequency of 1 GHz, and an EMI cut-off frequency of 2.95 GHz, appropriate heat sink fin dimensions and EMI attenuation can be calculated using the previous equations. EMI wavelength;

$$\lambda_a = \frac{c}{f}, \text{ thus for } f = 1\text{GHz}, \lambda_a = 11.8 \text{ inches} \tag{1}$$

Cut-off frequency;

$$f_c = \frac{5.9 \times 10^9}{a(\text{inches})}, \text{ thus for } f_c = 2.95\text{GHz}, a = 2 \text{ inches} \tag{3}$$

Cut-off frequency wavelength;

$$\lambda_c = \frac{c}{f_c}, \text{ thus for } f_c = 2.95\text{GHz}, \lambda_c = 4 \text{ inches} \tag{4}$$

Attenuation / Absorption loss in dB;

$$AdB = 54.5 \left(\frac{d}{\lambda_c}\right) \times \sqrt{1 - \left(\frac{\lambda_c}{\lambda_a}\right)^2}, \tag{7}$$

thus for $d = 4$ in, $AdB = 51dB$

With a depth d = 4 inches, estimated absorption losses for various maximum levels of EMI radiation are as follows: at 1 GHz, AdB = 51dB; at 2 GHz, AdB = 40dB; and at 3 GHz, AdB = 10dB. Assuming these levels of attenuation are insufficient for particular applications, varying the depth d will alter the attenuation provided by the waveguide array. The larger the depth d, the greater the attenuation achieved.

While a particular embodiment of the invention has been shown and described herein, it will be obvious that additional modifications may be made without departing from the spirit of this invention.

What is claimed is:

1. An apparatus for shielding electromagnetic radiation comprising:
  a substantially enclosed cavity having at least one opening;
  a noise source disposed within the substantially enclosed cavity; and blocking means disposed at the opening for blocking electromagnetic radiation and for transferring heat away from the enclosed cavity.

2. The apparatus of claim 1 wherein the blocking means is a frequency selective waveguide array.

3. The apparatus of claim 2 wherein the frequency selective waveguide array is dimensioned to establish a cutoff frequency and to determine levels of electromagnetic attenuation.

4. The apparatus of claim 2 wherein the frequency selective waveguide array is formed from heat sink fins, dimensioned to provide a heat transfer.

5. An apparatus for shielding electromagnetic radiation comprising:

a substantially enclosed cavity having an opening;
a noise sensitive device disposed within the substantially enclosed cavity; and
a waveguide array disposed at the opening for blocking electromagnetic radiation and for transferring heat away from the enclosed cavity.

6. The apparatus of claim 5 wherein the waveguide array is formed from a heat sink.

7. The apparatus of claim 6 wherein the heat sink is dimensioned to establish a cutoff frequency and to determine levels of radio emission attenuation.

8. The apparatus of claim 6 wherein the heat sink is dimensioned to be frequency selective within a range of radio emission frequencies.

* * * * *